May 13, 1958 R. A. GUDMUNDSEN ET AL 2,834,701
SEMICONDUCTOR TRANSLATING DEVICES
Filed June 1, 1956 2 Sheets-Sheet 1

RICHARD A. GUDMUNDSEN,
JOSEPH MASERJIAN, JR.
INVENTORS

BY [signature]
ATTORNEY

May 13, 1958 R. A. GUDMUNDSEN ET AL 2,834,701

SEMICONDUCTOR TRANSLATING DEVICES

Filed June 1, 1956 2 Sheets-Sheet 2

RICHARD A. GUDMUNDSEN,
JOSEPH MASERJIAN, JR.
INVENTORS.

BY [signature]
ATTORNEY

United States Patent Office 2,834,701

Patented May 13, 1958

2,834,701

SEMICONDUCTOR TRANSLATING DEVICES

Richard A. Gudmundsen and Joseph Maserjian, Jr., Inglewood, Calif., assignors to Hughes Aircraft Company, Culver City, Calif., a corporation of Delaware Application June 1, 1956, Serial No. 588,743

15 Claims. (Cl. 148—33)

The present invention relates to semiconductor devices and more particularly to fused junction semiconductor devices. The present invention is a continuation in part of copending United States patent application entitled, Semiconductor Translating Devices and Method of Making the Same, by Richard A. Gudmundsen and Joseph Maserjian, Jr., Serial No. 499,034, filed April 4, 1955, now abandoned.

In the semiconductor art, a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous, solid specimen of semiconductor material has an N-type region adjacent a P-type region, the boundary between the two regions is termed a P–N (or N–P) junction, and the specimen of semiconductor material is termed a P–N junction semiconductor device. Such a P–N junction device may be used as a rectifier. A specimen having two N-type regions separated by a P-type region, for example, is termed an N–P–N junction semiconductor device or transistor, while a specimen having two P-type regions separated by an N-type region is termed a P–N–P junction semiconductor device or transistor.

The term, "semiconductor material," as utilized herein is considered generic to both germanium and silicon, and is employed to distinguish these semiconductors from metallic oxide semiconductors, such as copper oxide and other semiconductors consisting essentially of chemical compounds.

The term, "active impurity," is used to denote those impurities which affect the electrical rectification characteristics of semiconductor material as distinguishable from other impurities which have no appreciable effect upon these characteristics. Active impurities are ordinarily classified either as donor impurities—such as phosphorus, arsenic, and antimony—or as acceptor impurities, such as boron, aluminum, gallium, and indium.

The term, "solvent metal," is used in this specification to describe those materials, which when in the liquid state, become solvents for the semiconductor material which is under consideration, and will therefore dissolve areas of semiconductor materials which are in contact with the solvent metal. A solvent metal may be a primary element or it may be an alloy.

As is well known in the art, the semiconductor crystal region between the opposed P–N junctions is termed the "base" region of the fused junction transistor. The first regrown region, having a conductivity type of the body region, is termed the "emitter" of the transistor. The second regrown crystal region, having a conductivity type identical to the conductivity type of the first regrown crystal region and opposed to the conductivity type of the base region is termed the "collector" region of the transistor. It is preferable in a fused junction transistor that the collector region have a diameter which is substantially greater than the diameter of the emitter region, and that the base region between the P–N junction be not more than 5 mils in thickness. An electrical conductor ohmically connected to the emitter regrown region is termed the "emitter electrode," while an electrical conductor ohmically connected to the collector region is termed the "collector electrode." If three connections are made to the fused junction transistor, the third electrical connection is an electrical conductor which is ohmically connected to the base region of the transistor and is termed the "base electrode."

As an example of the prior art methods for producing a fused junction transistor, and the difficulties encountered therein, the typical production of a P–N–P junction transistor will be described. Prior art production techniques most generally involve repetition of a series of manipulations on each of the individual semiconductor transistor bodies being produced. Many of the manipulations are carried out under the microscope since the units being handled and the dimensions involved are very small, and great skill is required of the operator in many steps. In general, in prior art techniques, semiconductor wafers are diced into individual squares which are commonly on the order of ⅛" on a side. As described hereinbefore, it is necessary in a fused junction transistor, that the thickness of the base region between the opposed emitter and collector junction, should be no more than about 5 mils in thickness. However, it is extremely difficult to manipulate semiconductor wafers, both before and after dicing into the smaller dice, when the semiconductor wafer is much thinner than 15 mils in thickness. For this reason, the dice which are approximately ⅛" on a side are on the order of 15 mils in thickness. In order to obtain a base region of the proper thickness, a pit is sandblasted into the center of each individual semiconductor die. After sandblasting, the pit has a floor which is the required 3 to 5 mils from the opposed surface of the semiconductor die, thus allowing a base region which, after fusion, is of the order of 1 mil in thickness. The individual semiconductor die is mounted in a setup or jig in which it is heated to a predetermined temperature. An aluminum wire is brought against the flush surface and then the opposed hollowed surface of the pit, in order to produce aluminum buttons with underlying regrown regions. Finally, a base electrode is ohmically connected to the base region of the P–N–P semiconductor transistor body.

The technique of the present invention is equally applicable to the production of semiconductor transistors as well as diodes. As in the case of transistors it is also advantageous in the production of diodes to provide relatively thin base regions. Among the advantages to be gained by the use of such thin base regions in semiconductor diodes are the following: higher volt-current characteristics may be achieved and better recovery time will also result. The term base region for the diode as used herein is intended to include the area of the semiconductor wafer which retains its initial conductivity type subsequent to the regrowth processes hereinafter to be discussed. Of course the term base region as used herein with respect to transistors includes that region intermediate the emitter and collector region.

Accordingly it is the object of the present invention to provide a method for fabricating semiconductor translating devices having relatively thin base regions.

It is a further object of the present invention to provide semiconductor diodes and transistors which include very thin base regions.

It is a still further object of the present invention to provide a method for fabricating semiconductor devices and such improved devices having base regions of proper thickness and optimum electrical characteristics.

It is another object of the present invention to provide a method of fabricating transistors and improved transistors having base regions of optimum thickness.

It is another object of the present invention to provide a method of fabricating a plurality of semiconductor translating devices from a single semiconductor wafer.

It is another object of the present invention to provide novel semiconductor transistors manufactured from a single semiconductor wafer.

It is another object of the present invention to provide a method of fabricating semiconductor transistors which obviates the necessity of pitting individual semiconductor die.

It is a further object of the present invention to provide a semiconductor body having a base region of optimum thickness for electrical characteristics which also has good mechanical characteristics.

It is a further object of the present invention to provide a semiconductor transistor having a base region of optimum thickness between collector and emitter junctions, while maintaining the mechanical strength of the transistor body.

It is a still further object of the present invention to provide a semiconductor diode having a very thin base region.

It is a still further object of the present invention to provide a method of fabricating semiconductor translating devices with precision and economy not heretofore possible by methods of the prior art.

The method of the present invention comprises the steps of ohmically affixing a mechanical backing to the base region of a semiconductor translating body, the mechanical backing being formed from the semiconductor material used as the base region, being of the same conductivity type as the base region, and having an electrical resistivity substantially less than that of the base region.

The present invention also provides novel semiconductor transistors and diodes and other semiconductor translating devices having a base region of optimum thickness to which is ohmically affixed a mechanical backing of semiconductor material.

The novel features which are believed to be characteristic of the invention, both as to its organization and method of operation, together with further objects and advantages thereof, will be better undertsood from the following description considered in connection with the accompanying drawings, in which a presently preferred embodiment of the invention is illustrated by way of example. It is to be expressly understood, however, that the drawings are for the purposes of illustration and description only, and are not intended as a definition of the limits of the invention.

The present invention method has been found to be especially adaptable to the production of semiconductor translating devices in which a plurality of P–N junctions are formed upon a single semiconductor wafer by the methods disclosed and claimed in copending United States patent applications, Serial No. 489,999, for "Method of Fabricating Fused-Junction Semiconductor Devices," by William B. Warren, filed April 4, 1955, and Serial No. 499,000, for "Method of Producing Fused Junction Semiconductor Devices," by Melvin J. Barrett et al., filed April 4, 1955, and assigned to the assignee of the present application, in which one embodiment of the invention of the present application is disclosed but not claimed. For that reason, the method of the present invention will be described, for purposes of illustrating the application and utility of the present method, in conjunction with the fabrication of a plurality of silicon P–N–P fused junction transistors, in which a plurality of P–N junctions are formed on a single N-type silicon wafer by accurately defining the site, size, and configuration of the regrown P-type silicon collector and emitter regions by means of the methods of the above applications. It will be apparent to those skilled in the art, however, that the described embodiment is illustrative only, and that the method of the present invention may be practiced to fabricate semiconductor diodes, photocells, power rectifiers, and other semiconductor devices which will be also briefly described herein. It will also be apparent to one skilled in the art that the present method is not limited by the method in which the P–N junctions are formed on the semiconductor wafer, but may be utilized to great advantage regardless of the method of forming the P–N junction regions.

Figure 1:
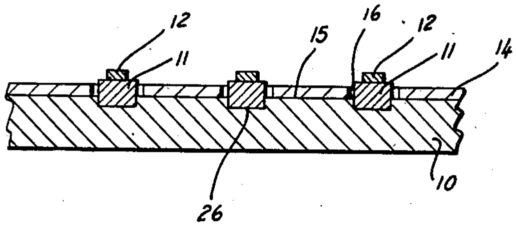
Figs. 1 through 4 are partial view in cross section of a semiconductor wafer showing, for the purpose of description and clarity, various steps in the complete fabrication of an illustrative semiconductor transistor fabricated by the method of the present invention.
Figure 2:
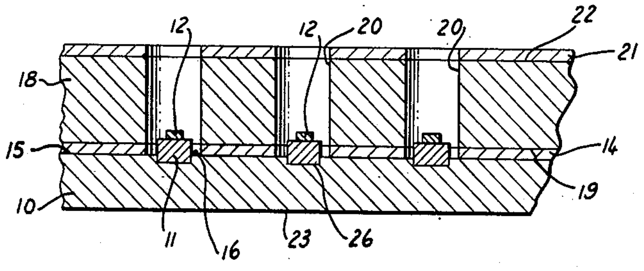

Referring now to the drawings and particularly Figs. 1 and 2, there is shown in Fig. 1 a partial view in cross section of a silicon N-type wafer 10 upon which a plurality of P-type regrown silicon regions 11 have been formed which are to be the collector regions for a plurality of transistors. In order to fully illustrate the method of the present invention, the silicon N-type wafer 10 is circular and is, for example, 1" in diameter and 15 mils in thickness. As described hereinbefore, a silicon wafer having a thickness of less than 15 mils has insufficient mechanical strength to allow easy manipulation and handling of the wafer during production steps. In this illustrative embodiment, forty transistor bodies, three of which are shown throughout the figures, are square and approximately ⅛" on a side, and are to be formed from the 1" silicon wafer. Therefore, forty regularly-spaced collector regions 11 which are 45 mils in diameter, spaced at intervals of 135 mils from center to center, have been formed in the surface of the silicon wafer 10 by the method disclosed and claimed in the copending application by William B. Warren, described above. An ohmic contact region 12 may also be ohmically affixed to each aluminum eutectic alloy at the surface of the regrown region 11 in order to facilitate the ohmic connection of a collector lead to the finished transistor body.

A layer of gold 14 of substantial thickness containing an active impurity of the same conductivity type as the conductivity type of the semiconductor wafer 10 is ohmically affixed to the surface 15 of the semiconductor wafer 10. Since the silicon wafer 10 in this embodiment is N-type, the gold is doped with approximately 0.5% antimony, which is a donor impurity. The ohmically affixed gold layer 14 covers the entire surface 15 of the silicon wafer with the exception of a ring 16 of free silicon which surrounds each collector region 11 to prevent short circuiting of the collector P–N junction. In the presently preferred embodiment a ring of free silicon 16 concentric with each collector region 11, and having an outside diameter of the order of 55 mils, is used.

Referring now particularly to Fig. 2, a mechanical backing 18 is prepared, having an area and configuration substantially equal to that of the surface 15 of the silicon wafer 10. Thus, the mechanical backing 18 is circular, having a diameter of the order of 1" and a substantially planar surface 19. Openings 20 are provided perpendicularly through the mechanical backing 18 to provide accessibility to the collector regions 11 and to prevent short circuiting of the collector junctions. Therefore, a plurality of perpendicular openings 20 which are of the order of 55 mils in diameter and are regularly spaced at intervals of 135 mils from center to center are provided through the mechanical backing 18 to properly mate the mechanical backing to the silicon wafer 10 and collector regions 11. The mechanical backing 18 is of the same material as the semiconductor wafer 10 and is thus silicon in this embodiment. The silicon mechanical backing has a minimum thickness of the order of 12 mils and is preferably 15 mils or more, for reasons that will appear hereinafter. The silicon mechanical backing 18 is not necessarily single crystal silicon, but is highly doped with the same type active impurity as the silicon wafer 10. In this embodiment, arsenic is used as the doping agent to make the silicon mechanical backing N-type silicon, which is the same as the N-type silicon wafer. The silicon mechanical backing 18 is sufficiently doped to cause its electrical resistivity to be substantially less than that of the silicon wafer 10, and in the presently preferred embodiment is doped to a resistivity value of the order of 0.001 times that of the semiconductor wafer 10. The amount of active impurity with which the mechanical backing is doped to provide it with an electrical resistivity value which is substantially less than that of the semiconductor wafer may be easily determined by one skilled in the art.

It has been found desirable in the production of certain devices according to the methods of the present invention to so heavily dope the mechanical backing to the point where it can no longer be accurately considered as a semiconductive material.

The silicon mechanical backing 18 is then ohmically affixed to the surface 15 of the silicon wafer 10. The method and means by which the silicon mechanical backing is ohmically affixed to the silicon wafer is not critical, and many methods known to the prior art may be used. However, excellent results have been achieved by utilizing the method in which a layer of gold 14 of substantial thickness containing antimony as an active impurity has been ohmically affixed to that portion of the surface 15 of the silicon wafer 10 which mates with the surface 19 of the silicon mechanical backing 18. A layer of gold 21 containing antimony as an active impurity is similarly ohmically affixed to both surfaces 19, 22 of the silicon mechanical backing 18. It will be apparent to one skilled in the art that the second affixed layer 21 facilitates the otherwise difficult connection of a base lead to the finished transistor. The silicon mechanical backing is then mated with the surface 15 of the silicon wafer, as shown in Fig. 2, and heated in a vacuum to a temperature above the melting point of gold-silicon eutectic. In the presently preferred embodiment a temperature of the order of 700° C. is used. A small pressure is then applied to the upper surface 22 of the silicon mechanical backing, causing the surface 15 of the silicon wafer and the surface 19 of the silicon mechanical backing 18 to be welded by the doped silicon-gold eutectic alloy. The assembled silicon mechanical backing and silicon wafer are then cooled at a controlled rate to prevent any possibility of cracking.

Figure 3:
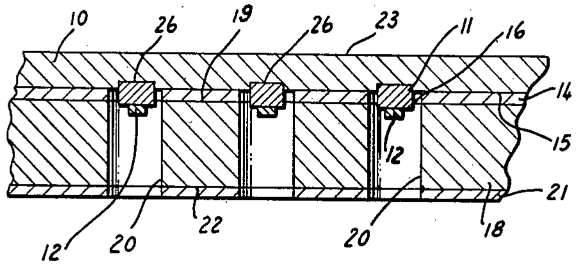

The combined silicon wafer 10 and silicon mechanical backing 18 are in effect a single silicon wafer having a thickness of the order of 30 mils. Referring to Fig. 3, the lower surface 23 of the silicon wafer 10 is lapped, by methods well known to the art, to the thickness which is desirable for the base region of the semiconductor devices being fabricated. In this illustrative example, to produce a plurality of P–N–P junction transistors, the lower surface 23 is lapped until the distance between the surface 15 and the lower surface 23 is of the order of 5 mils. At this point, the combined thickness of the silicon wafer 10 and the silicon mechanical backing 18 is 20 mils, which provides sufficient mechanical strength for ease of manipulation and further process steps. In order to complete the transistors being fabricated, a plurality of P-type regrown crystal regions 24, having centers coincident with the centers of the P-type collector regions, are formed by the method disclosed in copending application by William B. Warren, described above. The regrown emitter regions 24 are of the order of 15 mils in diameter and are regularly-spaced at intervals of 135 mils from center to center.

Figures 4, 5, 6:
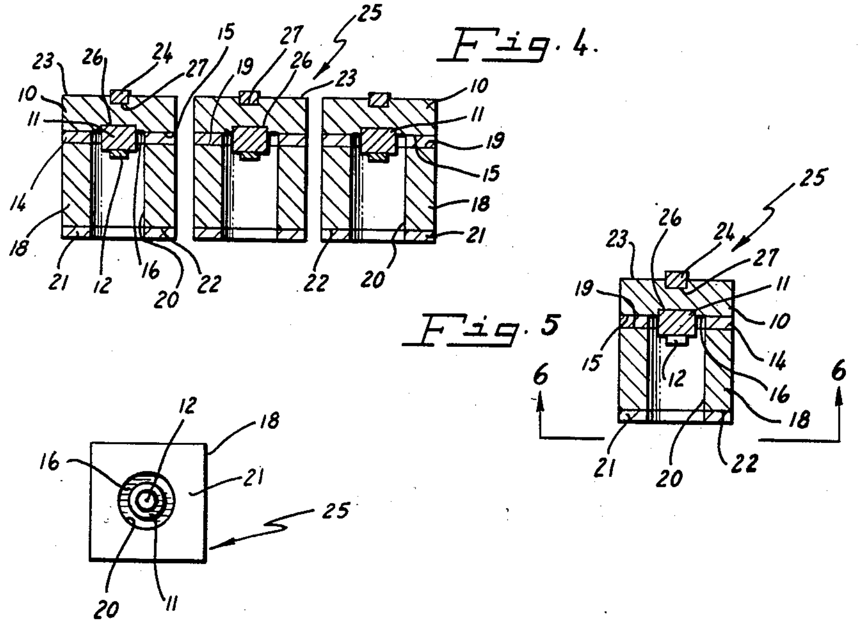
Fig. 5 is a view in cross section of a finished semiconductor transistor body fabricated in accordance with the present invention.
Fig. 6 is a plan view taken along line 6—6 of Fig. 5.

Thus referring to Fig. 4, forty P–N–P junction transistor bodies 25 have been formed on the single silicon wafer, and the wafer has an effective thickness of 20 mils with respect to mechanical strength. The plurality of transistors may now be separated into individual P–N–P transistor bodies by dicing the wafer between the regrown regions, as shown in Fig. 4. Since the width of the cut is substantially 10 mils, a finished transistor body 25 which is substantially 125 mils on a side results, as shown in Figs. 5 and 6.

After proper etching and surface treatments, the transistors are then ready for proper packaging and the connection of emitter, collector and base leads.

It may thus be seen that the transistor shown in Figs. 5 and 6 has a base region 10 of the order of 1 mil in thickness between the P–N collector 26 and emitter junctions 27. The ohmically affixed mechanical backing 18, however, allows ease of manipulation and production of a plurality of transistors without the necessity of pitting or individually processing each transistor body. The silicon mechanical backing 18 is high conductance silicon to which a base connection can be affixed, however, the semiconductor functions are performed, and the voltage current characteristics of the device are determined, by the silicon wafer 10 which forms the base region. The use of high conductivity silicon as the mechanical backing provides a transistor body having good mechanical characteristics in which the coefficient of expansion is uniform throughout, to allow thermal expansion and contraction of the body without detrimental effects or separation at the ohmically connected surfaces. The use of silicon for the mechanical backing, in this embodiment, or the same material as the semiconductor wafer, facilitates dicing of the assembled semiconductor wafer and mechanical backing since the backing material may be cut in the same manner as the semiconductor wafer without introducing any additional dicing problems. Further, the use of material for mechanical backing which is the same as that used for the semiconductor wafer does not complicate etching operations and does not poison the etch. It will be apparent to those skilled in the art that the method of the present invention is advantageous wherever a base region is required having a thickness which is less than the minimum thickness necessary for mechanical strength.

Figure 7:
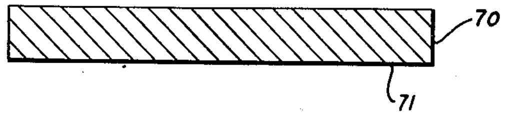
Figs. 7 through 9 are cross sectional views of a semiconductor starting wafer to be fabricated into a diode or a plurality of diodes according to another embodiment of the present invention.
Figure 8:
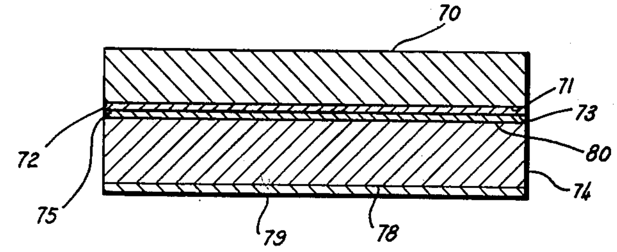
Figure 9:
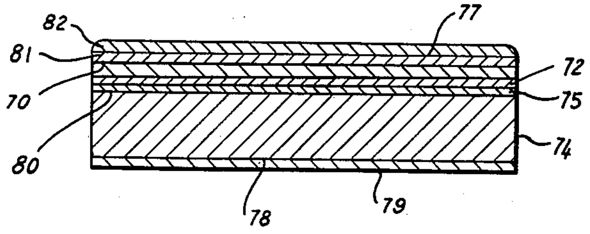

Referring now to Figs. 7 through 9 wherein there is shown N-type silicon semiconductor starting wafer 70 to be used in the manufacture of a silicon diode or diodes having a very thin base region. As in the methods hereinabove described in the production of a junction transistor, a gold-antimony alloy is deposited upon one surface 71 of crystal 70 to form layer 72. Likewise a gold antimony layer is deposited upon surfaces 73 and 78 to form respectively layers 75 and 79 upon heavily N-doped silicon backing wafer 74. The two wafers 71 and 74 are then brought together and heated to a value of temperature above the melting point of the gold silicon eutectic. A small pressure is then applied to the upper surface of the starting wafer 70, causing the surface 71 of the wafer and the surface 80 of the silicon backing 74 to be welded by the doped silicon gold eutectic alloy. The assembled silicon wafers are then cooled. Thereafter starting wafer 70 is reduced to a thickness as desired usually in the range of 5 and 15 mils. Thereafter the wafer 70 may be etched by any method known to the art. Subsequently a P-type impurity may be deposited upon surface 77 of wafer 70 by an evaporation technique or by any other method known to the art to produce a regrown P-type region 81, thus, producing a rectifying junction and hence a diode. An alloy region 82 will then be formed above region 81. Of course a series of diodes may be produced upon wafer 70 by fusing thereto a series of spaced pellets or wires.

containing a P-type impurity or by a masking technique in conjunction with the evaporation process hereinbefore referred to. Of course the hereinabove described method may be employed to form one large junction device which may then be diced into a plurality of smaller devices by any method known to the art.

Although the method of the present invention has been described in particular with reference to the fabrication of a plurality of semiconductor translating devices from a single semiconductor wafer, it will also be apparent that the method may be utilized in producing an individual semiconductor device.

Thus, the present invention provides an efficient and economical method of fabricating semiconductor translating devices as well as novel transistors by allowing reduction of the thickness of the base region of the semiconductor device, while maintaining and improving the mechanical strength of the semiconductor body.

What is claimed is:

1. A semiconductor translating device comprising: a semiconductor wafer selected from the group consisting of germanium and silicon of a predetermined conductivity type having first and second major faces; a region having a conductivity type opposite to that of said wafer within at least a portion of one of said major faces; and a separate mechanical backing member ohmically affixed to substantially the entire surface of at least one of said major faces of said wafer and spaced from said region, said separate mechanical backing member being of the same kind of semiconductor material as that of the said wafer and being of said predetermined conductivity type, and said separate mechanical backing member having an electrical resistivity substantially less than that of said semiconductor wafer.

2. The device of claim 1 wherein said separate mechanical backing member has a thickness substantially greater than the thickness of said semiconductor wafer.

3. A fused junction semiconductor translating device comprising: a semiconductor wafer selected from the group consisting of germanium and silicon of a predetermined conductivity type having first and second major faces; first and second regions having a conductivity type opposite to that of said wafer within said first and second major faces respectively; and a separate mechanical backing member ohmically affixed to substantially the entire surface of at least one of said major faces of said wafer and spaced from said region within said face, said separate mechanical backing member being of the same kind of semiconductor material as that of said wafer and being of said predetermined conductivity type, and said separate mechanical backing member having an electrical resistivity substantially less than said semiconductor material.

4. The device of claim 1 wherein said semiconductor wafer has a base region of a thickness not greater than 5 mils.

5. The device of claim 3 wherein said semiconductor wafer has a base region of a thickness not greater than 5 mils.

6. A fused junction silicon semiconductor translating device comprising: a silicon wafer of a predetermined conductivity type; a regrown crystal region of opposite conductivity type to that of said wafer adjacent at least a portion of a first surface of said silicon wafer; and a mechanical backing ohmically affixed to said surface of said silicon wafer and spaced from said region, said mechanical backing being silicon of said predetermined conductivity type, said silicon backing being substantially greater in thickness than said silicon wafer, and said silicon backing having an electrical resistivity substantially less than that of said silicon wafer.

7. A semiconductor diode comprising: a semiconductor wafer selected from the group consisting of germanium and silicon of a predetermined conductivity type having first and second major faces; a crystal region of a conductivity type opposite to that of said wafer adjacent at least a portion of said first surface of said wafer; and a separate mechanical backing member ohmically affixed by welding to substantially the entire area of said second surface of said wafer, said separate mechanical backing member being semiconductor material of said predetermined conductivity type, said backing being substantially greater in thickness than said wafer, and said backing having an electrical resistivity substantially less than that of said wafer.

8. A fused junction semiconductor translating device comprising: a semiconductor wafer selected from the group consisting of germanium and silicon of a predetermined conductivity type; a P–N junction region adjacent a first portion of a surface of said semiconductor wafer; and a mechanical backing ohmically affixed to a second portion of said surface surrounding and spaced from said P–N junction region, said mechanical backing being of the same material as said semiconductor wafer and being of said predetermined conductivity type.

9. A fused junction semiconductor translating device comprising: a semiconductor wafer selected from the group consisting of germanium and silicon of a predetermined conductivity type; a P–N junction region adjacent a first portion of a surface of said semiconductor wafer; and a mechanical backing ohmically affixed to a second portion of said surface surrounding and spaced from said P–N junction region, said mechanical backing being of the same material as said semiconductor wafer and being of said predetermined conductivity type, and said mechanical backing having an electrical resistivity substantially less than said semiconductor material.

10. A fused junction semiconductor translating device comprising: a semiconductor wafer selected from the group consisting of germanium and silicon of a predetermined conductivity type; a P–N junction region adjacent a first portion of a surface of said semiconductor wafer; and a mechanical backing ohmically affixed to a second portion of said surface surrounding and spaced from said P–N junction region, said mechanical backing being of the same material as said semiconductor wafer, said mechanical backing being of said predetermined conductivity type, said mechanical backing having an electrical resistivity substantially less than said semiconductor material, and said mechanical backing having a thickness substantially greater than the thickness of said semiconductor wafer.

11. A semiconductor fused junction transistor comprising: a semiconductor wafer selected from the group consisting of germanium and silicon; a first P–N junction region adjacent a first portion of a first surface of said semiconductor wafer; a second P–N junction region opposed to said first P–N junction region adjacent a second surface of said semiconductor wafer opposed to said first surface; a base region between said opposed P–N junction regions, said base region being not greater than 5 mils in thickness; and a mechanical backing ohmically affixed to said first surface of said semiconductor wafer surrounding and spaced from said first P–N junction region, said mechanical backing being of the same semiconductor material as said semiconductor wafer, said mechanical backing being of said predetermined conductivity type, and said mechanical backing having an electrical resistivity substantially less than that of said semiconductor wafer.

12. A semiconductor fused junction transistor comprising: a semiconductor wafer selected from the group consisting of germanium and silicon of a predetermined conductivity type; a first P–N junction region adjacent a portion of a first surface of said semiconductor wafer; a second P–N junction region opposed to said first P–N junction region adjacent a second surface of said semiconductor wafer opposed to said first surface; a base region between said opposed P–N junction regions, said base region being not greater than 5 mils in thickness; and a mechanical backing ohmically affixed to said first surface of said semiconductor wafer surrounding and spaced from said first P–N junction region, said mechanical backing being of the same semiconductor material as said semiconductor wafer, said mechanical backing being of said predetermined conductivity type, said mechanical backing having an electrical resistivity substantially less than that of said semiconductor material, and said mechanical backing having a thickness ssubstantially greater than the thickness of said semiconductor wafer.

13. A fused junction silicon transistor comprising: a silicon wafer having a predetermined conductivity type; a regrown crystal region of opposite conductivity type adjacent a portion of a first surface of said silicon wafer; a second regrown crystal region of said predetermined conductivity type opposed to said first regrown crystal region adjacent a portion of a second surface of said silicon wafer opposed to said first surface; and a mechanical backing ohmically affixed to said first surface of said silicon wafer surrounding and spaced from said first regrown crystal region, said mechanical backing being silicon of said predetermined conductivity type, said silicon mechanical backing being substantially greater in thickness than said silicon wafer, and said silicon mechanical backing having an electrical resistivity substantially less than that of the electrical resistivity of said silicon wafer.

14. A silicon fused junction transistor comprising: an N-type silicon wafer; a first P-type regrown crystal region adjacent a portion of a first surface of said silicon wafer; a second P-type regrown crystal region opposed to said first regrown region adjacent a portion of a second surface of said silicon wafer opopsed to said first surface; a base region between the first and second P–N junctions defined by said first and second regrown crystal regions, said base region being not greater than 5 mils in thickness; and a mechanical backing ohmically affixed to said first surface of said silicon wafer, said mechanical backing having a surface substantially equal in configuration to said first surface of said silicon wafer, said mechanical backing having an opening perpendicularly through said surface of said backing, said opening being substantially greater in area and symmetrical with said first regrown crystal region, said mechanical backing being N-type silicon, said silicon mechanical backing having an electrical resistivity which is substantially less than the electrical resistivity of said silicon wafer; and the combined thickness of said silicon wafer and said silicon mechanical backing being of the order of at least 15 mils.

15. A plurality of fused junction transistor bodies on a single semiconductor wafer comprising: an N-type silicon wafer; a first plurality of P-type regrown crystal regions adjacent a first surface of said silicon wafer, said first plurality of regrown regions being regularly spaced at a predetermined interval from center to center of said regions; a second plurality of P-type regrown crystal regions adjacent a second surface of said silicon wafer opposed to said first surface, said second plurality of regrown regions being regularly spaced at said predetermined interval from center to center of said regions opposed to said first plurality; a base region between the first and second plurality of P–N junctions defined by said first and second plurality of opposed regrown regions, said base region being not greater than 5 mils in thickness; and a mechanical backing ohmically affixed to said first surface of said silicon wafer, said mechanical backing having a surface substantially equal in configuration to said first surface of said silicon wafer, said mechanical backing having a plurality of openings perpendicularly through said surface of said backing, said openings being substantially greater in area and symmetrical with said first regrown crystal regions, said openings being regularly spaced at said predetermined interval from center to center coincident with said first regrown crystal regions, said mechanical backing being N-type silicon, said silicon mechanical backing having an electrical resistivity which is substantially less than the electrical resistivity of said silicon wafer; and the combined thickness of said silicon wafer and said silicon mechanical backing being of the order of at least 15 mils.

References Cited in the file of this patent

UNITED STATES PATENTS

| | | |
|---|---|---|
| 2,561,411 | Pfann | July 24, 1951 |
| 2,697,052 | Dacey et al. | Dec. 14, 1954 |
| 2,702,360 | Giacoletto | Feb. 15, 1955 |
| 2,703,855 | Koch et al. | Mar. 8, 1955 |
| 2,708,646 | North | May 17, 1955 |
| 2,778,980 | Hall | Jan. 22, 1957 |

FOREIGN PATENTS

| | | |
|---|---|---|
| 1,115,845 | France | Jan. 16, 1956 |